(12) United States Patent
Nagai et al.

(10) Patent No.: US 7,700,885 B2
(45) Date of Patent: Apr. 20, 2010

(54) WIRING BOARD

(75) Inventors: Makoto Nagai, Komaki (JP); Hisashi Wakako, Komaki (JP); Atsushi Uchida, Kagamigahara (JP); Masahito Morita, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 1030 days.

(21) Appl. No.: 11/410,195

(22) Filed: Apr. 25, 2006

(65) Prior Publication Data

US 2007/0095565 A1     May 3, 2007

(30) Foreign Application Priority Data

Apr. 25, 2005    (JP) .................. P. 2005-127012

(51) Int. Cl.
*H02G 3/18* (2006.01)
(52) U.S. Cl. ..................... 174/262; 174/265
(58) Field of Classification Search .......... 174/265, 174/262; 257/72
See application file for complete search history.

(56) References Cited

U.S. PATENT DOCUMENTS

| | | | |
|---|---|---|---|
| 5,122,475 A * | 6/1992 | Heckaman et al. .......... 438/107 |
| 5,814,883 A * | 9/1998 | Sawai et al. .................. 257/712 |
| 6,707,150 B1 * | 3/2004 | Lee ............................. 257/730 |
| 2005/0030752 A1 | 2/2005 | Imai | |

FOREIGN PATENT DOCUMENTS

| JP | 11-74561 A | 3/1999 |
|---|---|---|
| JP | 2001-291792 A | 10/2001 |
| JP | 2002-182589 A | 6/2002 |
| JP | 2004-228549 A | 8/2004 |

OTHER PUBLICATIONS

Japanese Office Action dated Oct. 14, 2008.

* cited by examiner

*Primary Examiner*—Jinhee J Lee
*Assistant Examiner*—Abiy Getachew
(74) *Attorney, Agent, or Firm*—Sughrue Mion, PLLC (57) ABSTRACT

A wiring board (1, 1*a*, 20, 20*a*) having: a board body (2, 22) including an insulating material and having a front surface (3, 23), a back surface (4, 24), a cavity (5, 25) having an opening in the front surface (3, 23) of the board body (2, 22) and having a bottom surface (6, 26) and a side surface (7, 27), and a projection which is provided on a front surface side of the side surface (7, 27) of the cavity and projects toward a center of the opening; a metal layer (11) provided on the side surface (7, 27) of the cavity; and an insulating portion which is provided on a back surface (9, 29) of the projection (8, 28) so as to define an obtuse angle (θ) with the metal layer (11), or which covers at least a top end portion of the metal layer (11).

4 Claims, 7 Drawing Sheets

WIRING BOARD

BACKGROUND OF THE INVENTION

1. Field of the Invention

The present invention relates to a wiring board including a light-emitting element mounted on the bottom surface of a cavity.

2. Description of the Related Art

In a wiring board having mounted thereon a light-emitting element, the emitted light can be collimated by adopting a structure in which a metal light reflection layer is arranged on the side surface of a cavity. A sealing resin is charged in the cavity so as to form a flat surface.

For example, a package for housing a light-emitting element has been proposed in which a ceramic frame having a through-hole is joined to a flat-plate-shaped ceramic base. A metal layer containing a refractory metal such as W or Mo and a metal plating layer containing Co are then formed in this order on the inner surface of the through-hole (see, e.g., JP-A-2004-228549, at pages 1-9 and FIGS. 1 and 4).

On the other hand, a photoelectric device has been proposed in which a photoelectric element is disposed in an opening space of a package. The side surface of the opening space is provided with a holding means to prevent peeling of a molding resin that is charged in the opening space (see, e.g., JP-A-11-74561, at pages 1-8 and FIGS. 1-5).

Incidentally, among the light reflection layers formed on the metal layer arranged on the side surface of the cavity in which the light-emitting element is mounted, a topmost metal plating layer of Ag or the like is thinner on a top end portion, for example, of the cavity side surface than on its middle portion.

Moreover, where the side surface of the cavity in which the light-emitting element is disposed is provided with a holding means that projects in cross section and serves to hold the molding resin (see, e.g., the photoelectric device of JP-A-11-74561 at pages 1-8, FIGS. 1-5), a plating liquid cannot easily circulate directly under the holding means in electroplating the metal layer formed on the side surface of the cavity with plating layers of Ni, Au, Ag, etc. As a result, those portions of the metal plating layers, in particular, the topmost Ag plating layer, which are formed on a top end portion of the metal layer directly under the holding means become thin. Also components of the underlying metal layer or metal plating layers may redeposit on the surface of the Ag plating layer. For example, in the case where an Ag layer is formed on a Ni layer, pinholes and the like tend to develop in a thin Ag layer. In that case, components of the lower Ni layer diffuse through the pinholes to redeposit on the surface of the Ag layer. The Ni forms an oxide (oxidation corrosion), and the Ni oxide gradually induces a change in color. In addition, by reacting with the Ni oxide, the Ag also induces a change in color. Such changes in color proliferate over time. That is, color changes are induced due to redeposition of an underlying plating layer in addition to variation in thickness of the respective plating layers, and such color change tends to originate and proliferate from the top end portion. Consequently, it becomes more difficult to efficiently reflect the light emitted from the light-emitting element.

SUMMARY OF THE INVENTION

It is therefore an object of the present invention to solve the above described problems of the prior art, so as to provide a wiring board having a light-emitting element mounted on the bottom surface of a cavity and a sealing resin that is charged in the cavity, wherein the sealing resin resists peeling and the light emitted from the light-emitting element can be reflected efficiently. That is, the present invention has been made with the objective of providing a projection or the like for holding a sealing resin in the opening of a cavity and preventing a color change of a metal plating layer due to insufficient circulation of a plating liquid.

A wiring board according to a first aspect of the invention comprises a board body comprising an insulating material and having a front surface, a back surface, a cavity having an opening in the front surface of the board body and also having a bottom surface and a side surface, and a projection provided on a front surface side of the side surface of the cavity and projecting toward a center of the opening; a metal layer formed on the side surface of the cavity; and an insulating portion provided on a back surface of the projection so as to form an obtuse angle with the metal layer.

With the above configuration, since the insulating portion is provided on the back surface of the projection so as to form an obtuse angle with the metal layer formed on the side surface of the cavity, a plating liquid can circulate sufficiently in the vicinity of the insulating portion when a metal plating layer is formed on the side surface of the cavity by electroplating. Consequently, a part of the resulting plating layer formed on a top end portion of the metal layer has approximately the same thickness as a part of the plating layer formed on a central portion of the metal layer. As a result, a metal component such as Ni of a lower metal plating layer is not prone to redeposition on the surface of the topmost metal plating layer such as an Ag plating layer. This prevents a change in color of the topmost Ag plating layer in proliferating from the top end portion as explained above. Furthermore, since the projection formed in the opening of the cavity projects toward the center of the opening, the projection can hold a sealing resin that is charged in the cavity so as to resist peeling. This allows the light emitted from a light-emitting element which is mounted on the bottom surface of the cavity to be efficiently emitted in an outward direction over a long period of time.

Examples of the insulating material of the board body include ceramics mainly made of alumina, glass-ceramics which are a kind of low-temperature-fired ceramics, and an epoxy resin.

The cavity may have shapes that are narrower on the bottom surface side than on the opening side, such as shapes that approximate a circular truncated cone, an elliptical truncated cone, a truncated cone whose horizontal cross section assumes an elongated circle, and truncated polygonal pyramids having four or more side faces. The cavity may also have, as a whole, shapes of a circular cylinder, an elliptical cylinder, a cylinder whose horizontal cross section assumes an elongated circle, and polygonal prisms having four or more side faces.

Instead of the projection that is formed along an entire circumference of the opening of the cavity, separate projections may be arranged at plural positions along the circumference of the opening of the cavity.

Where the insulating material is a ceramic or glass-ceramic, the metal layer is preferably made of W, Mo, Cu, Ag, or the like. Where the insulating material is a resin, the metal layer is preferably made of Cu or the like. For example, a metal plating layer, which is formed on the metal layer, may consist of a lowest Ni plating layer, a middle Au plating layer, and a topmost Ag, Pt, Rh, or Pd plating layer for light reflection.

The obtuse angle is preferably larger than 90° and smaller than or equal to 140°.

In addition, the light-emitting element is preferably a light-emitting diode (LED), a semiconductor laser (LD), or the like.

On the other hand, a wiring board according to a second aspect of the invention comprises a board body comprising an insulating material and having a front surface, a back surface, a cavity having an opening in the front surface of the board body and also having a bottom surface and a side surface, and a projection provided on a front surface side of the side surface of the cavity projecting toward a center of the opening; a metal layer provided on the side surface of the cavity; and an insulating portion covering at least a top end portion of the metal layer.

With this configuration, since the insulating portion covers at least the top end portion of the metal layer which is formed on the side surface of the cavity, a metal plating layer is not formed on that portion of the metal layer which is located directly under the projection and in the vicinity of which a plating liquid would not easily circulate if the insulating portion were not formed. In other words, since only that portion of the metal layer in the vicinity of which a plating liquid can circulate sufficiently is not covered with the insulating portion, a metal layer can be formed so as to have an approximately uniform thickness distribution. In this manner, the metal plating layer thus formed does not have a portion where a metal component such as Ni of a lower metal plating layer tends to redeposit on the surface of the topmost metal layer such as an Ag plating layer. This also prevents a change in color from proliferating in the topmost Ag plating layer, for example. Furthermore, since the projection is formed in the opening of the cavity so as to project toward the center of the opening, the projection can hold a sealing resin that is charged in the cavity so as to resist peeling. This allows the light emitted from a light-emitting element which is mounted on the bottom surface of the cavity to be efficiently emitted in an outward direction over a long period of time.

The wiring board according to the first aspect of the invention includes, as a preferable embodiment, a wiring board wherein the insulating portion has a curved surface which is recessed in a cross section taken perpendicularly to the front surface of the board body.

The curved surface includes surfaces which are bow-shaped, circular, parabolic, or hyperbolic or have like shapes as a whole in the cross section. The curved surface may even have local minute asperities. A line tangent to approximately the center of the curved surface and the metal layer formed on the side surface of the cavity form an obtuse angle as mentioned above.

With this measure, since the insulting portion made of the same insulating material as the projection and having the recessed curved surface is located on the back surface of the projection, a plating liquid can easily circulate in the vicinity of the insulating portion when a metal plating layer is formed by electroplating on another metal layer previously formed on the side surface of the cavity. As a result, a part of the resulting plating layer formed on a top end portion of the metal layer has approximately the same thickness as a part of the plating layer formed on a central portion of the metal layer. Consequently, a metal component such as Ni of a lower metal plating layer is not prone to redeposition on the top end portion. This prevents a change in color from proliferating in the topmost metal plating layer such as an Ag plating layer. This also allows the light emitted from a light-emitting element which is mounted on the bottom surface of the cavity to be efficiently emitted in an outward direction over a long period of time.

The wiring board according to the first aspect of the invention also includes, as a preferred embodiment, a wiring board wherein the insulating portion has a slanted surface which is inclined, in a cross section taken perpendicularly to the front surface of the board body, in such a manner that an inner diameter of the cavity increases toward the back surface of the board body.

The slanted surface is not limited to a single slanted surface, and may be composed of plural slanted surfaces having different inclination angles.

With this measure, since the back surface of the projection is formed with the insulting portion made of the same insulating material as the projection and having a slanted surface which is inclined in such a manner that the inner diameter of the cavity increases toward the back surface of the board body, a plating liquid can easily circulate in the vicinity of the insulating portion. As a result, a top end portion of the resulting plating layer has approximately the same thickness as the central portion of the metal layer. As a result, a metal component of a lower metal plating layer is not prone to be deposited on the surface of the topmost metal plating layer, whereby a color change is not prone to occur in the topmost metal plating layer. This allows the light emitted from a light-emitting element which is mounted on the bottom surface of the cavity to be efficiently emitted in an outward direction over a long period of time.

The wiring board according to the second aspect of the invention includes, as a preferred embodiment, a wiring board wherein the insulating portion has a curved surface which is recessed in a cross section taken perpendicularly to the front surface of the board body.

The wiring board according to the second aspect of the invention includes, as a preferred embodiment, a wiring board wherein the insulating portion has a slanted surface which is inclined, in a cross section taken perpendicularly to the front surface of the board body, in such a manner that an inner diameter of the cavity increases toward the back surface of the board body.

Like the above-described wiring boards, these wiring boards allow the light emitted from a light-emitting element which is mounted on the bottom surface of the cavity to be efficiently emitted in an outward direction over a long period of time.

In addition, the invention encompasses a wiring board in which the side surface of the cavity is a slanted surface which is inclined in such a manner that the inner diameter of the cavity increases in the direction from the side of the back surface of the board body (i.e., the bottom surface of the cavity) to the side of the front surface of the board body. In this case, the light emitted from a light-emitting element which is mounted on the bottom surface of the cavity can be reflected at a relatively large reflection angle.

The invention also encompasses a wiring board in which the projection and the side surface are formed in different insulating layers that are subsequently laminated.

In this case, the cavity excluding the bottom surface can be formed and the back surface of the projection can easily be formed with the insulating portion having the curved surface or the slanted surface. This is done by laminating/compression-bonding the one insulating layer, where the back side of the portion to become the projection is softened by application of a solvent or where an insulative paste is formed on the back surface, and the other insulating layer having a through-hole which is to become the cavity.

The insulating portion having the curved surface or the slanted surface can be formed by the above method even in the case where the insulating layers are made of one of various kinds of resins, in addition to the case where the insulating layers are made of a ceramic.

The invention also encompasses a wiring board in which a continuous metal layer is formed on the side surface of the cavity and an adjacent portion of the back surface of the insulating layer in which the projection is formed. Even if the metal layer is formed on the side surface of the cavity and the adjacent portion of the back surface of the insulating layer in which the projection is formed, the invention makes it possible to form, by electroplating, a metal plating layer having a uniform thickness distribution on a major portion, including a top end portion, of the metal layer.

DESCRIPTION OF REFERENCE NUMERALS

Reference numerals used to identify various structural features in the drawings include the following.

1, 1a, 20, 20a, 40, 50, 60, 60a, 70, 70a . . . . Wiring board
2, 22, 42, 52, 62, 72 . . . . Board body
3, 23, 43, 53, 63, 73 . . . . Front surface
4, 24, 44, 54 . . . . Back surface
5, 25, 45, 55, 60, 60a, 70, 70a . . . Cavity
6, 26, 46, 56, 66, 76 . . . Bottom surface
7, 27, 47, 57, 67, 77 . . . Side surface
8, 28, 48, 58 . . . projection
9, 29 . . . Back surface of projection
10, 30 . . . Insulating portion
10a, 30a . . . Curved surface
11 . . . Metal layer
11b . . . Top end portion
12 . . . Plating layer
15 . . . Light-emitting element
18, 32 . . . Insulating portion 18a, 32a . . . Slanted surface (Tapered surface)
θ . . . Obtuse angle

DETAILED DESCRIPTION OF THE INVENTION

The present invention will next be described in detail with reference to the drawings. However, the present invention should not be construed as being limited thereto.

Figure 1:
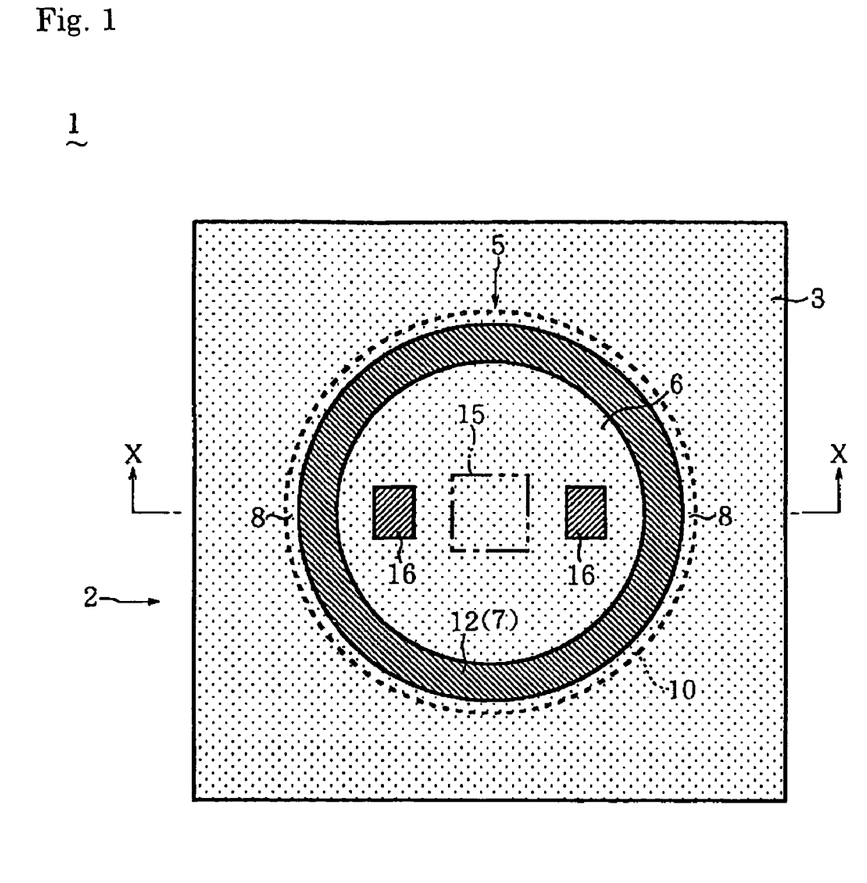
FIG. 1 is a plan view of a wiring board according to an embodiment of the present invention.
Figure 2:
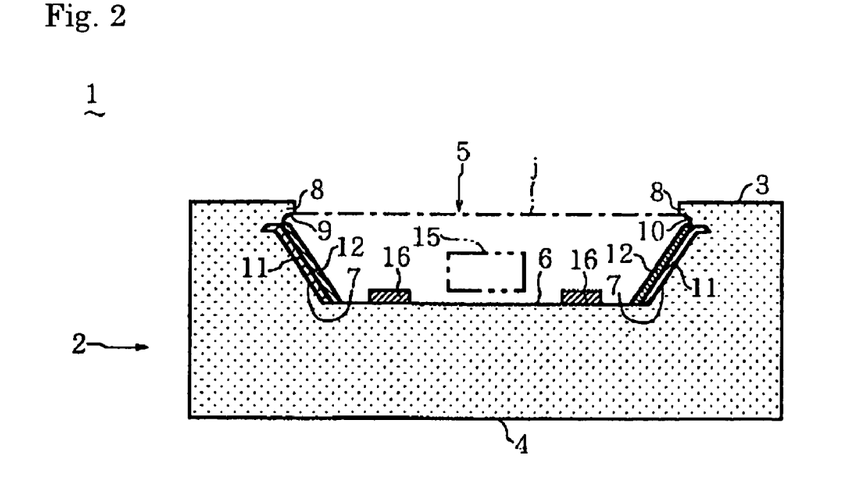
FIG. 2 is a sectional view taken along line X-X in FIG. 1.
Figure 3:
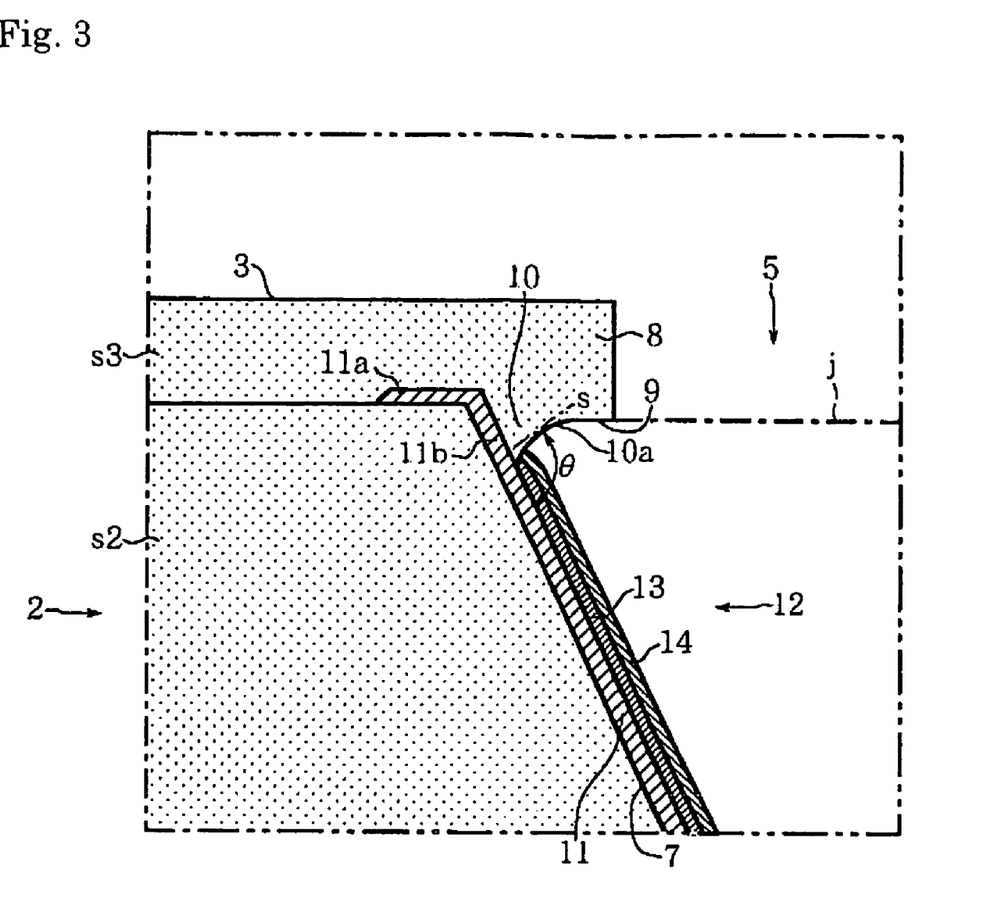
FIG. 3 is an enlarged sectional view of part of FIG. 2, that is, a projection and its vicinity.

FIG. 1 is a plan view of a wiring board 1 according to an embodiment of the invention. FIG. 2 is a sectional view taken along line X-X in FIG. 1. FIG. 3 is an enlarged sectional view of part of FIG. 2.

As shown in FIGS. 1 and 2, the wiring board 1 includes a board body 2 which has a front surface 3 and a back surface 4 and is made of a ceramic (insulating material), and has a cavity 5 which has an opening in the front surface 3 of the board body 2 and a light-emitting diode (light-emitting element) 15 mounted on bottom surface.

As shown in FIGS. 1 and 2, the board body 2 assumes a rectangular parallelepiped shape which is approximately square in plan view and has a prescribed thickness. The board body 2 is formed by laminating plural green sheets mainly made of alumina and firing to form a ceramic. The board body 2 measures approximately 5 mm×5 mm×0.9 mm. Wiring layers having a prescribed pattern and via conductors (both not shown) mainly made of W or Mo are formed inside the board body 2, and contact pads (not shown) are formed on the back surface 4. Alternatively, the board body 2 may be formed by laminating plural glass-aluminum green sheets, for example, and firing to form a glass-ceramic.

As shown in FIGS. 1 and 2, the cavity 5 has a bottom surface 6 which is circular in plan view and a side surface 7 which is inclined so as to extend from the circumference of the bottom surface 6 toward the front surface 3 of the board body 2. As such, the cavity 5 is approximately shaped like a circular truncated cone. The elevation angle of the side surface 7 is set as appropriate in a range of 30° to 70°.

The cavity 5 is formed so as to be shaped approximately like a circular truncated cone by punching a green sheet using a punch and a die having a prescribed clearance. The cavity 5 measures about 3.6 mm in the inner diameter of the top circumference and about 0.45 mm in depth.

As shown in FIGS. 1-3, a ring-shaped projection 8 including part of the front surface 3 of the board body 2 is located on the board front surface side of the side surface 7 of the cavity 5 and projects toward the center of the opening. A back surface 9 of the projection 8 is formed, along the entire circumference of the opening of the cavity 5, with an insulating portion 10 having a curved surface 10a that is recessed in a cross section taken perpendicularly to the front surface 3 of the board body 2. The insulating portion 10 having the curved surface 10a is a portion, extending toward the bottom surface 6 of the cavity 5, of the insulating material of the projection 8.

A metal layer 11 made of W or Mo and a metal plating layer 12 for reflecting the light emitted from the light-emitting diode 15 are formed on the side surface 7 of the cavity 5. As shown in FIG. 3, the metal plating layer (hereinafter referred to as "plating layer") 12 consists of an Ni plating layer 13 formed on the metal layer 11 and an Ag plating layer 14 for light reflection formed on the Ni plating layer 13. The insulating portion 10 having the curved surface 10a covers a top end portion 11b of the metal layer 11. Although in this embodiment the plating layer 12 is formed on that portion of the metal layer 11 which is lower than (i.e., on the side of the board back surface 4) the top end portion 11b that is covered with the insulating portion 10, the invention is not limited thereto. Satisfactory results are obtained as long as the plating layer 12 is formed on at least part of the metal layer 11 excluding its top end portion 11b.

As shown in FIG. 3, the angle θ formed by the metal layer 11 and a line s tangent to approximately the center of the curved surface (line) 10a of the insulating portion 10 is an obtuse angle (e.g., 110°).

A horizontal portion 11a extending from the top end portion 11b of the metal layer 11 is arranged between ceramic layers s2 and s3 which are part of the board body 2. The projection 8 is part of the ceramic layer s3 and the side surface 7 of the cavity 5 is a surface of the ceramic layer s2, the ceramic layers s2 and s3 being different ceramic layers laid one on another.

As shown in FIGS. 1 and 2, the light-emitting diode 15 is mounted on a central portion of the bottom surface 6 of the cavity 5 via solder or an epoxy resin and a pair of pads 16 are formed on the bottom surface 6 symmetrically on both sides of the light-emitting diode mounting area. The pads 16 are also made of W or Mo and Ni, Au, or Ag plating layers are formed on the surfaces of the pads 16. The pads 16 are electrically connected to the light-emitting diode 15 via respective boding wires (not shown).

As indicated by a chain line in FIGS. 2 and 3, a solidified sealing resin j is charged in the cavity 5 in which the light-emitting diode 15 is mounted, the light-emitting diode being electrically connected to the pair of pads 16 via the bonding wires. For example, the top surface of the sealing resin j is flush with the back surface 9 of the projection 8.

Figure 4:
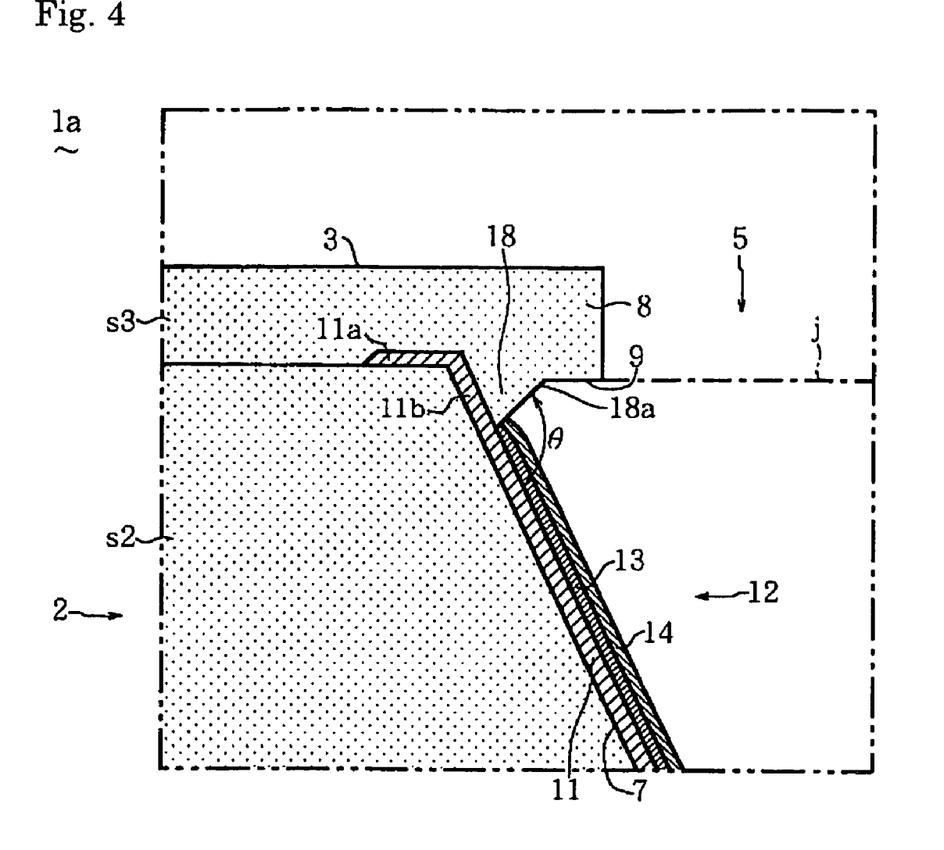
FIG. 4 is an enlarged sectional view, corresponding to FIG. 3, of part of another form of wiring board.

FIG. 4 is an enlarged sectional view, corresponding to FIG. 3, of part of a wiring board 1a having another form. The wiring board 1a is provided with a board body 2, a cavity 5, and a projection 8 which are similar to the corresponding ones of the wiring board 1. A back surface 9 of the projection 8 is formed, along the entire circumference of the opening of the cavity 5, with an insulating portion 18 having a slanted surface 18a which is inclined in such a manner that the inner diameter increases toward a back surface 4 of the board body 2. The insulating portion 18 having the slant surface 18a is a portion, extending toward the bottom surface 6 of the cavity 5, of the insulating material of the projection 8, and covers a top end portion 11b of a metal layer 11. The angle θ formed by the slanted surface 18a of the insulating portion 18 and the metal layer 11 which is formed on a side surface 7 of the cavity 5 is an obtuse angle (e.g., about 100°).

The metal layer 11 which is similar to that of the wiring board 1 is formed on the side surface 7 of the cavity 5 and between parts of ceramic layers s2 and s3. A plating layer 12 consisting of an Ni plating layer 13 and an Ag plating layer 14 for light reflection is formed on the metal layer 11. The top end of the plating layer 12 is located close to the bottom end of the insulating portion 18. As indicated by a chain line in FIG. 4, a sealing resin j is charged in the cavity 5.

The above-described wiring boards 1 and 1a can be manufactured in the following manner.

Figure 5:
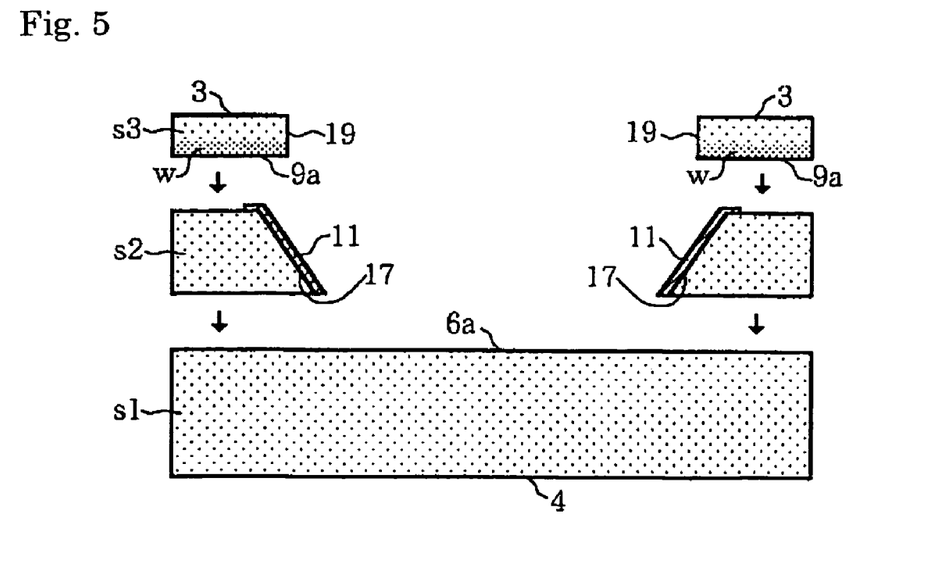
FIG. 5 is a schematic view showing a manufacturing step of each of the above wiring boards.

Green sheets s1-s3 made of a ceramic material mainly made of alumina are prepared as shown in the sectional view of FIG. 5. For the sake of convenience, the green sheets s1-s3 are given the same symbols as the corresponding ceramic layers s1-s3.

The lowest green sheet s1 is a laminated body of plural green sheets which assumes a flat plate shape having a back surface 4 and a front surface 6a, part of which will become the bottom surface 6 of the cavity 5. Wiring layers having a prescribed pattern and via conductors (both not shown) mainly made of W or Mo are formed inside the laminated body.

As shown in FIG. 5, a through-hole 17 approximately shaped like a circular truncated cone is formed through the middle green sheet s2 by punching using a punch and a die having a prescribed clearance or by pushing a die approximately shaped like a circular truncated cone into a through-hole formed by punching with a minimum clearance. A metal layer 11 containing W or Mo powder is formed on the side surface of the through-hole and a portion, adjacent to it, of the front surface of the green sheet s2 by a known printing method or the like.

As shown in FIG. 5, the uppermost green sheet s3 has a front surface 3 which will become the front surface of the board body 2 and a back surface 9a which will become the back surface 9 of the projection 8 and also has a through-hole 19 formed by punching and shaped like a flat cylinder. The inner diameter of the through-hole 19 is smaller than that of the top circumference of the through-hole 17 of the green sheet s2. A solvent w such as n-butyl phthalate, castor oil, or n-butyl alcohol is applied to the back surface 9a of the green sheet s3 so as to permeate into the green sheet s3 at a prescribed depth.

The above green sheets s1-s3 are laid one on another and then compression-bonded in the thickness direction. Alternatively, the green sheets s1-s3 are compression-bonded as they are laid one on another in order.

Figure 6:
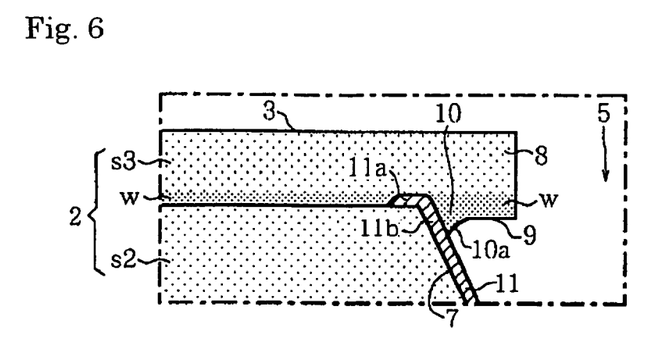
FIG. 6 is a partial schematic view showing a manufacturing step following that of FIG. 5.

As a result, as shown in FIG. 6, the green sheets s1-s3 are laminated, whereby a board body 2 and a cavity 5 are formed. At the same time, a projection 8 of the green sheet s3 which includes part of the front surface 3 of the board body 2 and projects toward the center of the opening of the cavity 5 is formed above the side surface 7 of the cavity 5. The projection 8 is formed a little thicker than the green sheet s3 which is compression-bonded to the green sheet s2.

Furthermore, as shown in FIG. 6, a portion, softened by the solvent w, of the ceramic material (insulating material) of the projection 8 extends (projects) toward the bottom surface 6 of the cavity 5 by pressure applied in the compression bonding and covers a top end portion 11b of the metal layer 11.

As a result, an insulating portion 10 is formed which has a curved back surface 10a that is arc-shaped and recessed in a cross section taken perpendicularly to the front surface 3 of the board body 2 including the projection 8.

Figure 8:
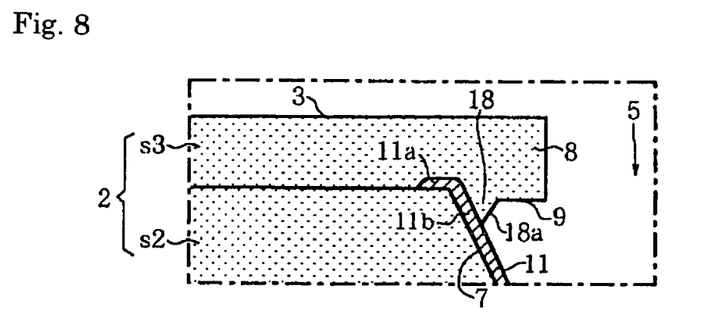
FIG. 8 is a partial schematic view showing a manufacturing step following that of FIG. 7.

The portion of the ceramic material of the projection 8 is extended toward the bottom surface 6 of the cavity 5 by adjusting the permeation depth of the solvent w in the green sheet s3 and the pressure of the compression bonding. As a result, the back surface 9 of the projection is formed with an insulating portion 18 as shown in FIG. 8 having a slanted surface 18a that is inclined in such a manner that the inner diameter increases toward the back surface 4 of the board body 2.

The green sheet laminated body obtained by laying the green sheets s1-s3 one on another and pressure-bonding is fired in a prescribed temperature range and is then sequentially subjected to Ni electroplating and Ag electroplating, whereby a plating layer 12 consisting of an Ni plating layer 13 and an Ag plating layer 14 are formed on that portion of the metal layer 11 which was not covered with the insulating portion 10 or 18.

In each plating process, since the back surface 9 of the projection 8 has the insulating portion 10 having the curved surface 10a or the insulating portion 18 having the slanted surface 18a, the plating liquid circulates smoothly even near that portion of the metal plate 11 which is adjacent to the projection 8. As a result, as shown in FIGS. 3 and 4, a wiring board 1 or 1a is obtained in which the top end portions of the Ni plating layer 13 and the Ag plating layer 14 of the plating layer 12 have approximately the same thickness as their respective central portions.

The term "approximately the same thickness" means that the thickness difference between the top end portion and the central portion is within ±20%. The angle θ formed by the curved surface 10a or the insulating portion 10 or the slanted surface 18a of the insulating portion 18 and the metal layer 11 formed on the side surface of the cavity 5 is an obtuse angle.

Figure 7:
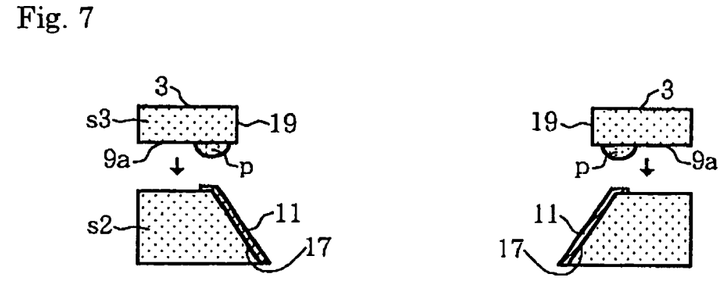
FIG. 7 is a schematic view showing another type of manufacturing step.

As shown in FIG. 7, after insulative paste p is formed on the back surface 9a of the green sheet s3 outside the through-hole 19 so as to be circular-ring-shaped in plan view and to be approximately semicircular in cross section, the green sheets s1-s3 are laid one on another and compression-bonded in the same manner as described above. The insulative paste p contains the same type of alumina, etc., as contained in the green sheets s1-s3 and also contains a small excess amount of organic components such as a solvent.

As a result, as indicated by FIG. 8 (enlarged view of a part), a board body 2, a cavity 5, and a projection 8 are formed similar to the above-described structures.

The insulative paste p and a portion of the ceramic material (insulating material) of the projection 8 are extended (projected) into the space between the back surface 9 of the projection 8 and the side surface 7 of the cavity 5 toward the bottom surface 6 of the cavity 5 by pressure applied in the compression bonding. As a result, an insulating portion 18 is formed which has a slanted surface 18a that is inclined, in a cross section taken perpendicularly to the front surface 3 of the board body 2 including the projection 8, in such a manner that the inner diameter increases toward the back surface 4 of the board body 2.

In this manner, we succeeded in forming an insulating portion 10 having a curved surface 10a on the back surface 9 of the projection 8 by adjusting the sectional shape of the insulating paste p and the pressure of the compression bonding.

The laminated body of the green sheets S1-S3 is fired in the same manner as described above and is then sequentially subjected to Ni electroplating and Ag electroplating, whereby a wiring board 1 or 1a in which a plating layer 12 consisting of an Ni plating layer 13 and an Ag plating layer 14 is formed on that portion of the metal layer 11 which is not covered with the insulating portion 10 or 18.

In each plating process, by virtue of the presence of the slanted surface 18a or the curved surface 10a, the plating liquid circulates smoothly even near that portion of the metal plate 11 which is adjacent to the projection 8. As a result, the top end portions of the Ni plating layer 13 and the Ag plating layer 14 have approximately the same thickness as their respective central portions.

In the above wiring board 1 or 1a, the back surface 9 of the projection 8 including part of the front surface 3 of the board body 2 is formed with the insulating portion 10 having the curved surface 10a or the insulating portion 18 having the slanted surface 18a in such a manner that the insulating portion 10 or 18 covers the top end portion 11b of the metal layer 11 formed on the side surface 7 of the cavity 5. Also, the angle θ formed by the curved surface 10a or the slant surface 18a and the metal layer 11 is an obtuse angle. This allows a plating liquid to circulate smoothly in each plating process. As a result, the plating layer 12 consisting of the Ni plating layer 13 and the Ag plating layer 14 whose top end portions have approximately the same thickness as their respective central portions are formed reliably on the metal layer 11 which is provided on the side surface 7 of the cavity 5. Since Ni of the lower Ni plating layer 13 is not deposited on the surface of the upper Ag plating layer 14, a change in the color of the Ag plating layer 14 is prevented. Therefore, the Ag plating layer 14 is able to efficiently reflect light emitted from the light-emitting diode 15 mounted on the bottom surface 6 of the cavity 5, and to efficiently emit the reflected light in an outward direction over a long period of time.

Furthermore, the sealing resin j is surrounded by the projection 8 when the sealing resin j is charged into the cavity 5 and solidified after the light-emitting diode 15 is mounted on the bottom surface 6 of the cavity 5. Because the projection 8 is formed along the entire circumference of the opening of the cavity 5 so as to project toward the center of the opening, the sealing resin j is held in a stable posture and resists peeling off from the cavity 5.

Figure 9:
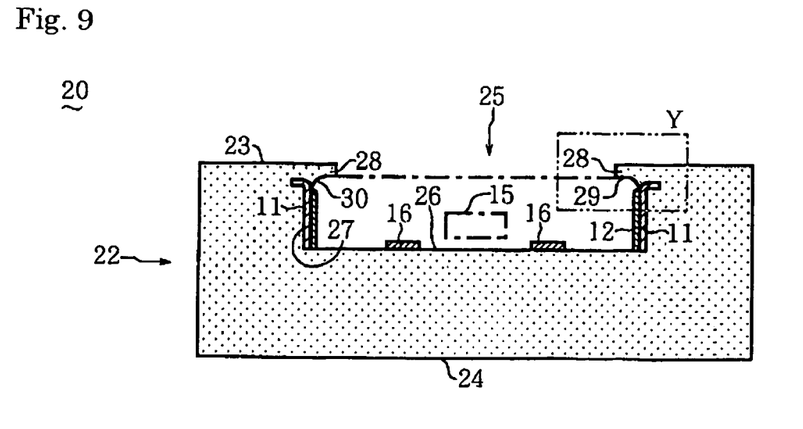
FIG. 9 is a vertical sectional view of a modification of the wiring board of FIG. 1.
Figure 10:
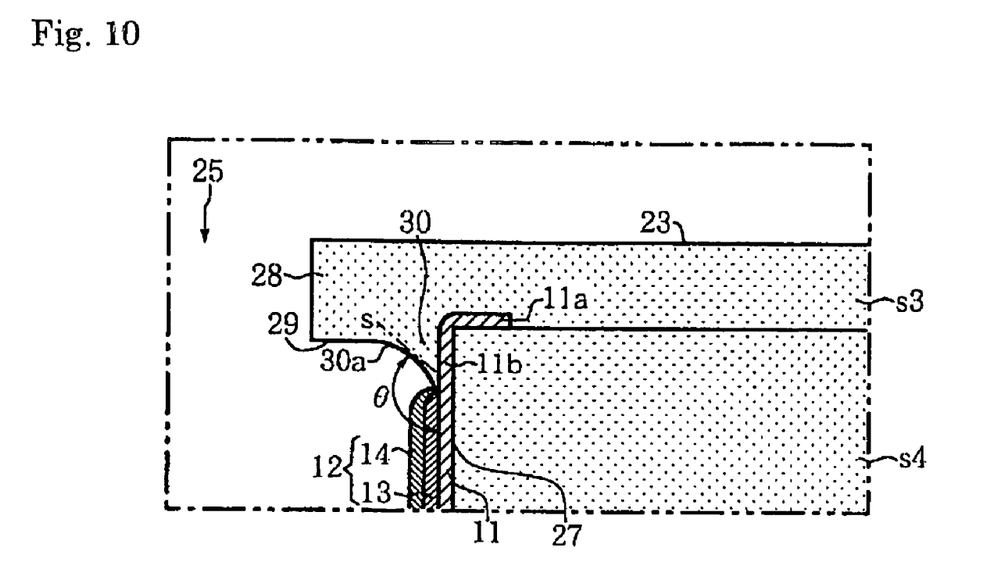
FIG. 10 is an enlarged view of part Y which is indicated by a two-dot chain line in FIG. 9.

FIG. 9 is a vertical sectional view of a wiring board 20 which is a modification of the above-described wiring board 1. FIG. 10 is an enlarged view of part Y which is indicated by a two-dot chain line in FIG. 9.

As shown in FIGS. 9 and 10, the wiring board 20 is provided with a board body 22 and a cavity 25. Like the above-described board body 2, the board body 22 is made of ceramic (insulating material) and has a front surface 23 and a back surface 24. The cavity 25 has an opening in the front surface 23 of the board body 22 and is defined by a bottom surface 26 which is circular in plan view and a cylindrical side surface 27 which erects vertically from the circumference of the bottom surface 26.

As shown in FIGS. 9 and 10, a ring-shaped projection 28 including part of the front surface 23 of the board body 22 is located on the board front surface side of the side surface 27 of the cavity 25 and projects toward the center of the opening. A back surface 29 of the projection 28 is formed with an insulating portion 30 having a curved surface 30a that is recessed and arc-shaped in a cross section taken perpendicularly to the front surface 23 of the board body 22 including the projection 28. The insulating portion 30 is formed as a result of extension, toward the bottom surface 26 of the cavity 25, of the ceramic material of the projection 28.

A metal layer 11 made of W, Mo, or the like and a plating layer 12 for reflecting the light emitted from a light-emitting diode 15 mounted on the bottom surface 26 approximately at the center are formed on the side surface 27 of the cavity 25. As shown in FIG. 10, the plating layer 12 consists of an Ni plating layer 13 formed on the metal layer 11 and an Ag plating layer 14 for light reflection formed on the Ni plating layer 13. A top end portion 11b of the metal layer 11 is covered with the insulating portion 30 having the curved surface 30a.

As shown in FIG. 10, the angle θ formed by the metal layer 11 and a line s tangent to approximately the center of the curved surface (line) 30a of the insulating portion 30 is an obtuse angle. A horizontal portion 11a extending from the top end portion 11b of the metal layer 11 is arranged between ceramic layers s3 and s4 which are parts of the board body 22.

As shown in FIGS. 9 and 10, the light-emitting diode 15 is mounted on the bottom surface 26 of the cavity 25 in the same manner as described above, and a pair of pads 16 are formed symmetrically on both sides of the light-emitting diode 15. The pads 16 are electrically connected to the light-emitting diode 15 individually in the same manner as described above.

As indicated by a chain line in FIG. 9, a solidified sealing resin j is charged in the cavity 25 in which the light-emitting diode 15 is mounted, the light-emitting diode 15 being electrically connected to the pair of pads 16 via bonding wires. For example, the top surface of the sealing resin j is flush with the back surface 29 of the projection 28.

Figure 11:
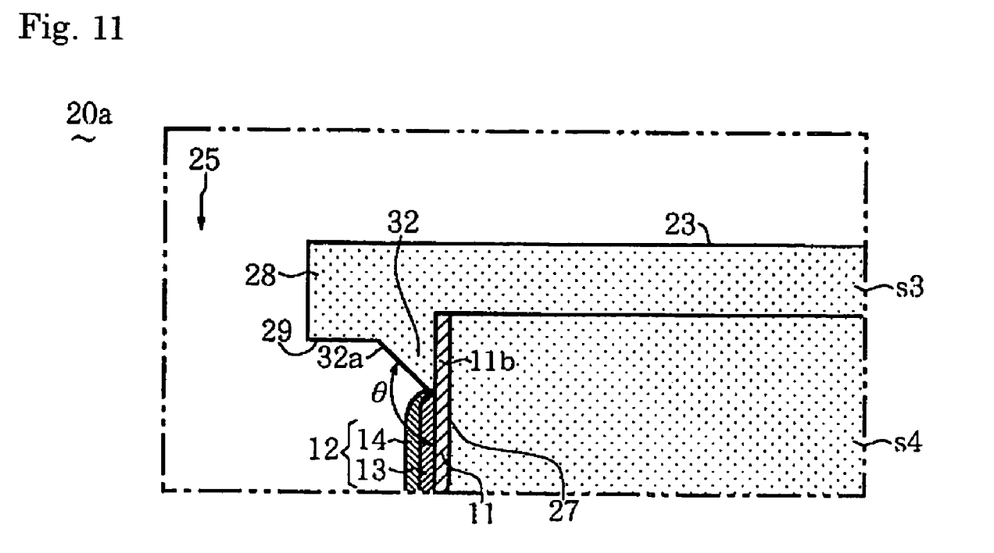
FIG. 11 is an enlarged sectional view, corresponding to FIG. 10, of part of a modification of the wiring board of FIG. 4.

FIG. 11 is an enlarged sectional view, corresponding to FIG. 10, of part of a wiring board 20a which is a modification of the wiring board 1a. The wiring board 20a is provided with a board body 22 (see FIG. 9), a cavity 25, and a projection 28 which are similar to corresponding ones of the wiring board 20. A back surface 29 of the projection 28 is formed, along the entire circumference of the opening of the cavity 25, with an insulating portion 32 having a slanted surface 32a which is inclined in such a manner that the inner diameter increases toward a back surface 24 of the board body 22 (see FIG. 9).

The insulating portion 32 covers a top end portion 11b of a metal layer 11 which is formed on a side surface 27 of the cavity 25. The angle θ formed by the slant surface 32a of the insulating portion 32 and the metal layer 11 is an obtuse angle (e.g., about 140°).

The metal layer 11 which is similar to that of the wiring board 20 is formed on the side surface 27 of the cavity 25. A plating layer 12 consisting of an Ni plating layer 13 and an Ag plating layer 14 is formed on the metal layer 11. The top end of the plating layer 12 is located close to the bottom end of the insulating portion 32. A sealing resin j is charged in the cavity 25 in the same manner as shown in FIG. 9.

The wiring boards 20 and 20a are manufactured by a manufacturing method similar to the lamination/compression bonding process which has been described above with reference to FIGS. 5-8.

In the above wiring board 20 or 20a, since the back surface 29 of the projection 28 is formed with the insulating portion 30 having the curved surface 30a or the insulating portion 32 having the slanted surface 32a, a plating liquid circulates smoothly in each plating process. As a result, the plating layer 12 consisting of the Ni plating layer 13 and the Ag plating layer 14 whose top end portions have approximately the same thickness as their respective central portions are reliably formed on the metal layer 11 provided on the side surface 27 of the cavity 25. Since Ni of the lower Ni plating layer 13 is not deposited on the surface of the upper Ag plating layer 14, a change in color of the Ag plating layer 14 is prevented. Therefore, the Ag plating layer 14 is able to efficiently reflect the light emitted from the light-emitting diode 15 mounted on the bottom surface 26 of the cavity 25, and to efficiently emit the reflected light in an outward direction over a long period of time.

Furthermore, the sealing resin j is surrounded by the projection 28 when the sealing resin j is charged into the cavity 25 and solidified after the light-emitting diode 15 is mounted on the bottom surface 26. Because the projection 28 is formed along the entire circumference of the opening of the cavity 25, the sealing resin j is held stably without peeling off from the cavity 25.

Figure 12:
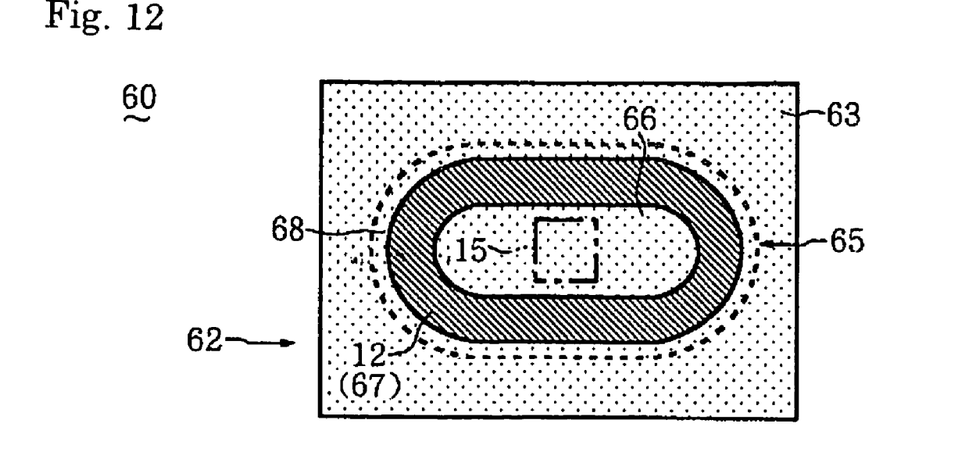
FIG. 12 is a schematic plan view of a wiring board having another form of cavity.
Figure 13:
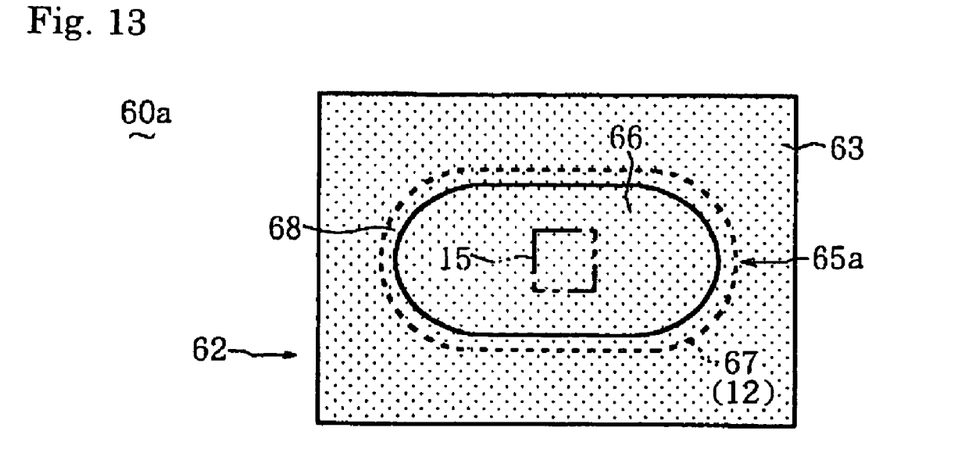
FIG. 13 is a schematic plan view of a wiring board which is a modification of the wiring board of FIG. 12.

FIG. 12 is a schematic plan view of a wiring board 60 having another form of cavity. FIG. 13 is a schematic plan view of a wiring board 60a which is a modification of the wiring board 60.

As shown in FIG. 12, the wiring board 60 is provided with a board body 62 and a cavity 65. The board body 62 is rectangular in plan view and is made of ceramic similar to the above-described one. The cavity 25 has an opening in a front surface 63 of the board body 62. The cavity 25 is defined by a bottom surface 66 which is shaped like an elongated circle in a plan view and a side surface 67 which is the circumferential surface of a truncated cone whose horizontal cross section is approximately shaped like an elongated circle and which extends from the circumference of the bottom surface 66 and is inclined in such a manner that its inner diameter increases toward the front surface 63 of the board body 62. A light-emitting diode 15 and pads (not shown) for electrical connection to the light-emitting diode 15 are formed on the bottom surface 66 of the cavity 65. A plating layer 12 is formed on the side surface 67 of the cavity 65 via a metal layer 11 in the same manner as described above.

As shown in FIG. 12, a projection 68 including part of the front surface 63 of the board body 62 is located on the board front surface side of the side surface 67 of the cavity 65 and projects toward the center of the opening. A back surface, facing the cavity 65, of the projection 68 is formed with an insulating portion extending toward the bottom surface 66 of the cavity 65 and having a curved surface which forms an obtuse angle with the metal layer 11 or an insulating portion extending toward the bottom surface 66 and having a slanted surface which forms an obtuse angle with the metal layer 11.

On the other hand, as shown in FIG. 13, the wiring board 60a is provided with a board body 62 similar to the above one and a cavity 65a. The cavity 65a has an opening in a front surface 63 of the board body 62 and is defined by a bottom surface 66 which is shaped like an elongated circle in plan view and a side surface 67 which is the circumferential surface of a cylinder whose horizontal cross section is approximately shaped like an elongated circle and which erects vertically from the circumference of the bottom surface 66. A light-emitting diode 15, etc., are formed on the bottom surface 66 of the cavity 65a. A plating layer 12 is formed on the side surface 67 of the cavity 65a via a metal layer 11.

As shown in FIG. 13, a projection 68 including part of the front surface 63 of the board body 62 is located on the opening side of the side surface 67 of the cavity 65a and projects in the same manner as described above. A back surface, facing the cavity 65a, of the projection 68 is formed with an insulating portion extending toward the bottom surface 66 of the cavity 65a and having a curved surface which forms an obtuse angle with the metal layer 11 or an insulating portion extending toward the bottom surface 66 and having a slanted surface which forms an obtuse angle with the metal layer 11.

Figure 14:
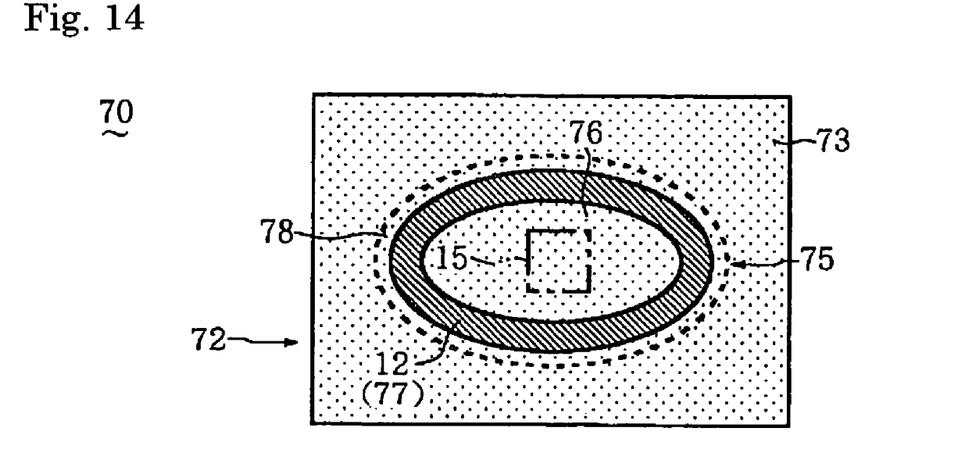
FIG. 14 is a schematic plan view of a wiring board having yet another form of cavity.
Figure 15:
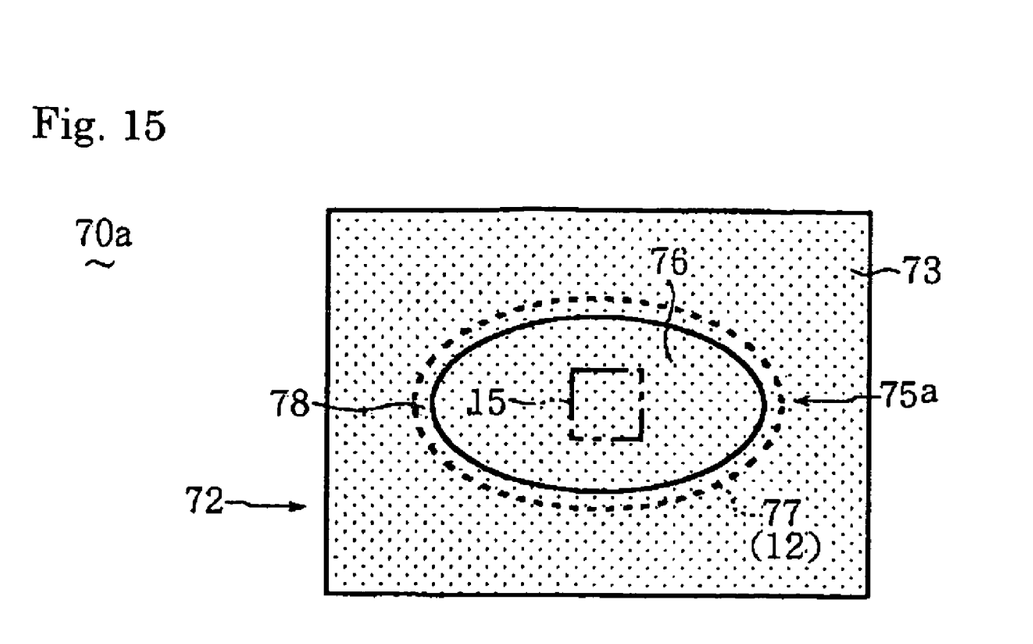
FIG. 15 is a schematic plan view of a wiring board which is a modification of the wiring board of FIG. 14.

FIG. 14 is a schematic plan view of a wiring board 70 having yet another form of cavity. FIG. 15 is a schematic plan view of a wiring board 70a which is a modification of the wiring board 70.

As shown in FIG. 14, the wiring board 70 is provided with a board body 72 and a cavity 75. The board body 72 is rectangular in plan view and is made of ceramic similar to the above-described board body. The cavity 75 has an opening in a front surface 73 of the board body 72 and is defined by a bottom surface 76 which is elliptical in plan view and a side surface 77 which is the circumferential surface of an approximately elliptical truncated cone and which extends from the circumference of the bottom surface 76 and is inclined in such a manner that its inner diameter increases toward the front surface 73 of the board body 72. A light-emitting diode 15 and pads (not shown) for electrical connection to the light-emitting diode 15 are formed on the bottom surface 76 of the cavity 75. A plating layer 12 is formed on the side surface 77 of the cavity 75 via a metal layer 11 in the same manner as described above.

As shown in FIG. 14, a projection 78 including part of the front surface 73 of the board body 72 is located on the board front surface side of the side surface 77 of the cavity 75 and projects toward the center of the opening. A back surface, facing the cavity 75, of the projection 78 is formed with an insulating portion extending toward the bottom surface 76 of the cavity 75 and having a curved surface which forms an obtuse angle with the metal layer 11 or an insulating portion extending toward the bottom surface 76 and having a slanted surface which forms an obtuse angle with the metal layer 11.

On the other hand, as shown in FIG. 15, the wiring board 70a is provided with a board body 72 which is similar to the above board body and a cavity 75a. The cavity 75a has an opening in a front surface 73 of the board body 72 and is defined by a bottom surface 76 which is elliptical in plan view and a side surface 77 which is the circumferential surface of an elliptical cylinder and which erects vertically from the circumference of the bottom surface 76. A light-emitting diode 15, etc., are formed on the bottom surface 76 of the cavity 75a. A plating layer 12 is formed on the side surface 77 of the cavity 75a via a metal layer 11

As shown in FIG. 15, a projection 78 including part of the front surface 73 of the board body 72 is located on the board front surface side of the side surface 77 of the cavity 75a and projects in the same manner as described above. A back surface, facing the cavity 75a, of the projection 78 is formed with an insulating portion extending toward the bottom surface 76 of the cavity 75a and having a curved surface which forms an obtuse angle with the metal layer 11 or an insulating portion extending toward the bottom surface 76 and having a slanted surface which forms an obtuse angle with the metal layer.

The wiring boards 60, 60a, 70, 70a are manufactured in the same manner as described above, and offer the same advantages as the wiring boards 1, 1a, 20 and 20a.

The invention is not limited to the above-described embodiments, and various modifications may be made within the spirit and scope of the invention.

For example, the ceramic constituting the insulating material of the board body 2, 22, etc., may be a ceramic whose main component is mullite or aluminum nitride, for example. Alternatively, it may be a glass-ceramic which is a kind of low-temperature-fired ceramic, in which case the metal layer 11, the pads 16, etc., are made of Cu, Ag, or the like.

The insulating material of the board body 2, 22, etc., may be an epoxy resin or the like, in which case the following manufacturing method may be employed. Plural resin insulating layers made of an epoxy resin, for example, are laid sequentially on a thin plate made of an epoxy resin or the like or a metal thin film, and a cavity is formed in the relatively high resin insulating layers by a known photolithography technique. A projection as described above is formed on the side of the opening of the cavity, and the back surface of the projection is formed, at a prescribed position with an insulating portion having a curved surface or a slanted surface. The tip surface of the projection may have a slanted surface.

The shape of the cavity is not limited to the shapes of the above embodiments. The cavity may be square or rectangular in plan view, and conductive paste may be applied to the four corners so as to assume an arc shape. A metal layer and a plating layer for light reflection may be formed on the side surfaces of the cavity.

Instead of forming the projection along the entire circumference of the opening of the cavity, separate projections may be arranged at plural positions along the circumference of the opening of the cavity.

In addition, according to the invention, plural cavities may be formed so as to have openings in the front surface of one wiring board. It is also possible to dispose plural mounting areas on the bottom surface of a single cavity and to mount light-emitting elements on the respective mounting areas.

This application is based on Japanese Patent Application JP 2005-127012, filed Apr. 25, 2005, the entire content of which is hereby incorporated by reference, the same as if set forth at length.

What is claimed is:

1. A wiring board comprising:
a board body comprising an insulating material and having a front surface, a back surface, a cavity having an opening in the front surface of the board body and having a bottom surface and a side surface, and a projection provided on a front surface side of the side surface of the cavity projecting toward a center of the opening; a metal layer provided on the side surface of the cavity; and an insulating portion provided on a back surface of the projection so as to define an obtuse angle with the metal layer, wherein the insulating portion has a slanted surface which is inclined, in a cross section taken perpendicularly to the front surface of the board body, in such a manner that an inner diameter of the cavity increases toward the back surface of the board body.

2. A wiring board comprising: a board body comprising an insulating material and having a front surface, a back surface, a cavity having an opening in the front surface of the board body and having a bottom surface and a side surface, and a projection which is provided on a front surface side of the side surface of the cavity projecting toward a center of the opening; a metal layer provided on the side surface of the cavity; and an insulating portion covering at least a top end portion of the metal layer, wherein the insulating portion has a slanted surface which is inclined, in a cross section taken perpendicularly to the front surface of the board body, in such a manner that an inner diameter of the cavity increases toward the back surface of the board body.

3. The wiring board as claimed in claim 1, wherein the insulating portion has a curved surface which is recessed in a cross section taken perpendicularly to the front surface of the board body.

4. The wiring board as claimed in claim 2, wherein the insulating portion has a curved surface which is recessed in a cross section taken perpendicularly to the front surface of the board body.

* * * * *